(12) United States Patent
Obinelo et al.

(10) Patent No.: US 7,435,051 B2
(45) Date of Patent: Oct. 14, 2008

(54) MULTI-STAGE BLOWER

(75) Inventors: Izuh Obinelo, Nashua, NH (US); Rajesh M. Nair, Nashua, NH (US)

(73) Assignee: Degree Controls, Inc., Milford, NH (US)

( * ) Notice: Subject to any disclaimer, the term of this patent is extended or adjusted under 35 U.S.C. 154(b) by 612 days.

(21) Appl. No.: 11/032,523

(22) Filed: Jan. 10, 2005

(65) Prior Publication Data

US 2006/0153676 A1 Jul. 13, 2006

(51) Int. Cl.
*F04D 17/00* (2006.01)
(52) U.S. Cl. .................. 415/228; 416/175; 416/203
(58) Field of Classification Search .............. 415/64, 415/84, 86, 83, 192, 198.1, 199.1, 228, 175; 416/178, 187, 201 A, 203, 175
See application file for complete search history.

(56) References Cited

U.S. PATENT DOCUMENTS 5,755,557 A * 5/1998 Alizadeh ............... 416/193 R

2002/0180285 A1 12/2002 Machiroutu
2004/0101399 A1 5/2004 Chang et al.
2004/0247441 A1 * 12/2004 Kim et al. ............... 416/179

FOREIGN PATENT DOCUMENTS

JP 62-113896 5/1987
JP 2002-019445 1/2002

OTHER PUBLICATIONS

Search Report for International Application PCT/US2006/000826, (May 9, 2006).

* cited by examiner

*Primary Examiner*—Edward Look
*Assistant Examiner*—Dwayne J White
(74) *Attorney, Agent, or Firm*—Schwegman, Lundberg & Woessner, P.A.

(57) ABSTRACT

A blower is formed with multiple sets of rotatable rings of blades coupled to each other. Multiple inlet rings are correspondingly coupled to the multiple sets of rotatable rings of blades. In one embodiment, the blades may be forward facing blades and include a volute to accomplish pressure recovery. In further embodiments, the blades are backward facing. Such backward facing blades are designed to provide a static pressure rise. In some embodiment, three or more rings of blades with corresponding inlet rings are utilized.

35 Claims, 6 Drawing Sheets

MULTI-STAGE BLOWER

BACKGROUND

Equipment, such as rack-level telecommunications equipment and computer room blade servers require cooling. Axial fans and centrifugal impeller based blowers are commonly mounted on top of the equipment and used to move air through such equipment for cooling purposes. The air is usually inducted at a front portion of the equipment, circulated past a bank of one or more vertical blades, electronic boards, or circuit packs, and finally exhausted at the back of the equipment, away from personnel. This commonly requires a ninety degree change in the direction of airflow.

In addition to the direction change, and partly because of it, the pressure drop across servers and telecom rack equipment can become quite high due to several factors. Packaging densities including small board pitch and/or dense component layout, air filtration requirements, and changes in direction of airflow can all contribute to the pressure drop. Impellers typically develop higher static pressures compared to axial fans, and are well suited to these types of high pressure applications where an axial fan may not be powerful enough to overcome the back pressure at a required cooling air flow rate.

One drawback of current centrifugal blowers is that they require either scrolling (forward-blade impellers) or breathing room on the sides (backward-blade impellers) because of the circumferential discharge. This makes it difficult to pack the blowers tightly in a tray to provide good airflow distribution among the circuit packs. Further, centrifugal blowers may have a smaller intake area as compared to the overall diameter of the impellers. This can make it more difficult to obtain even airflow distribution over the circuit packs, especially when plenum space is limited.

SUMMARY

A blower is formed with multiple sets of rotatable rings of blades coupled to each other. Multiple inlet rings are correspondingly coupled to the multiple sets of rotatable rings of blades. In one embodiment, the blades may be forward facing blades and include a volute to accomplish pressure recovery. In further embodiments, the blades are backward facing. Such backward facing blades are designed to provide a static pressure rise. In some embodiment, three or more rings of blades with corresponding inlet rings are utilized.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
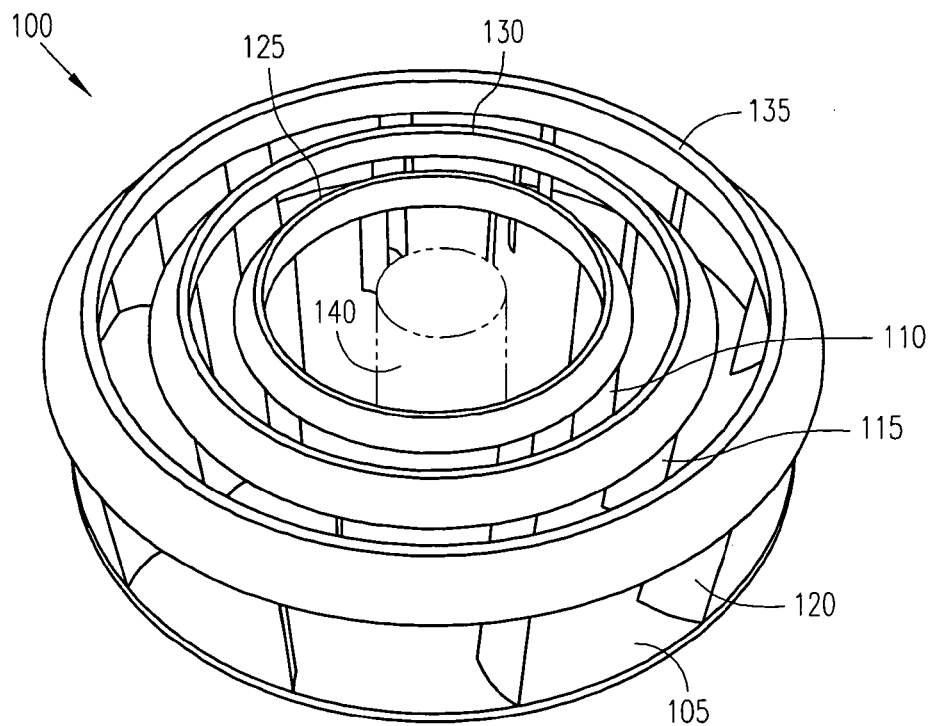
FIG. 1 is a perspective view of a multi-stage blower according to an example embodiment.

FIG. 1 is a perspective view of a multi-stage blower 100 according to an example embodiment. In one embodiment, the blower is a multi-stage motorized centrifugal blower. The blower 100 has a support plate 105 that is generally in the shape of a wheel or circle. The support plate 105 has multiple rings of blades that rotate to cause air to flow. A first ring of blades 110 is the smallest in diameter. A second ring of blades 115 has a larger diameter, and a third ring of blades 120 has the largest diameter. Each of the rings of blades has a corresponding inlet ring, as indicated at 125, 130 and 135.

The rings rotate in a clockwise direction. The blades are curved in a convex direction in the direction of rotation. This type of blade is referred to as a backward facing blade. Blades that are curved in concave direction in the direction of rotation are referred to as forward facing blades. The size and number of blades in each ring are designed to account for increasing volumetric airflow in the radial direction.

In one embodiment, an in-hub motor 140 is coupled to the support plate and rotates the entire blower. In-hub motor 140 may be disposed within the first ring of blades 110, and coupled to support plate 105 for rotating the support plate and rings. A portion of the motor 140 is coupled through the support plate to a stationary support, which is not shown. The blower 100 may also be rotated by a motor positioned opposite the support plate 105 from the rings, or may further be belt driven in a known manner. Still further methods of rotating a blower known to those skilled in the art may be used. In further embodiments, other means for rotating the blower 100 may be utilized, including drive belt assemblies or frictional contact with an edge of the blower. Other methods will be apparent to those of skill in the art.

Inlet rings are triangular shaped to guide airflow into the blades. Two adjacent inlet rings form an intake port for a successive stage or ring of blades. The first intake port is a central cylindrical opening defined by the inlet ring 125. A second intake port is defined as the opening between inlet ring 125 and inlet ring 130. A third intake port is defined as the opening between inlet ring 130 and inlet ring 135.

Pressure recovery, a static pressure rise in the radial direction, is accomplished with backward facing blades by controlling the size and number of blades, as well as the curvature of the blades. For forward facing blade design pressure recovery is effected through a volute used to shroud the entire wheel.

Figure 2:
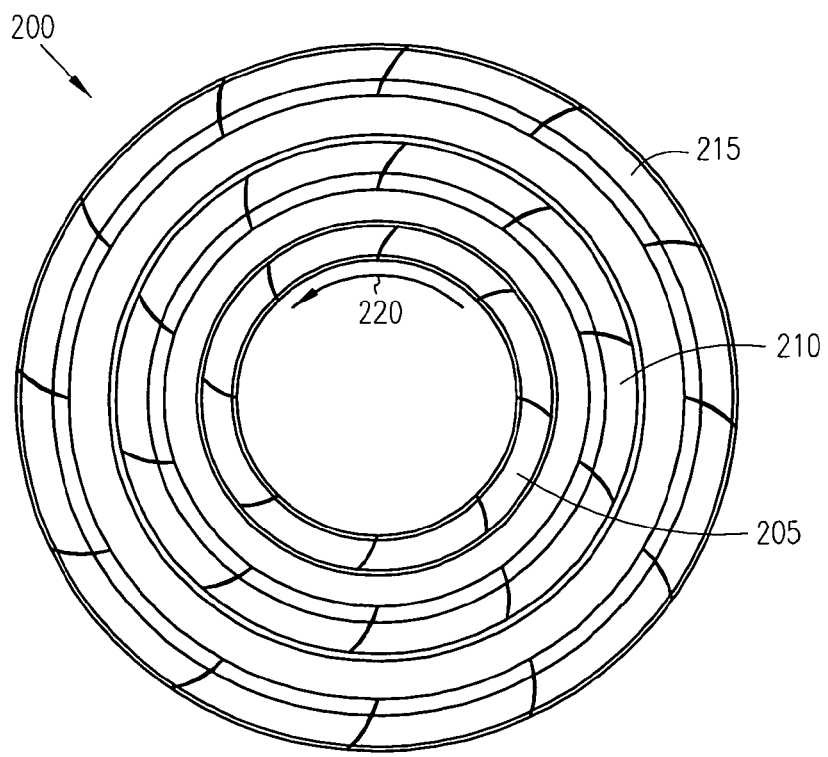
FIG. 2 is a wire frame top view of a multi-stage blower having backward facing blades according to an example embodiment.

FIG. 2 is a wire frame top view of a multi-stage blower 200 having backward facing blades according to an example embodiment. Means for rotating blowers are not shown in the remaining figures for simplicity, but may be similar to those described for the blower of FIG. 1. Blower 200 has three concentric rings of backward curved blades 205, 210 and 215. The direction of rotation of the rings is counterclockwise as indicated by arrow 220. Ring 205 has eight backward facing blades. Ring 210, which has a larger diameter than ring 205 has ten backward facing blades, and ring 215 has twelve backward facing blades. The actual numbers of blades may vary. In this embodiment, each larger diameter ring has an increasing number of blades to account for the static pressure rise.

Figure 3:
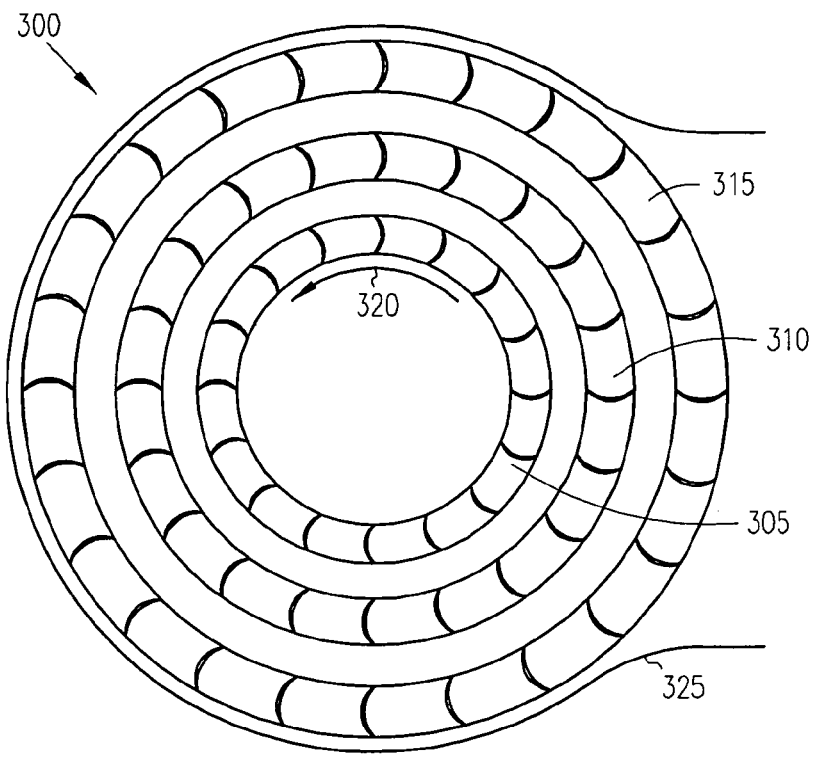
FIG. 3 is a wire frame top view of a multi-stage blower having forward facing blades according to an example embodiment.

FIG. 3 is a wire frame top view of a multi-stage blower 300 having forward facing blades according to an example embodiment. Blower 300 has three concentric rings of forward curved blades 305, 310 and 315. The direction of rotation of the rings is counterclockwise as indicated by arrow 320. Ring 305 has sixteen forward facing blades. Ring 310, which has a larger diameter than ring 305 has twenty forward facing blades, and ring 315 has twenty-four forward facing blades. The actual numbers of blades may vary. In this embodiment, each larger diameter ring has an increasing number of blades. A volute 325 surrounds a significant portion of the blower to account for the static pressure rise.

Figure 4:
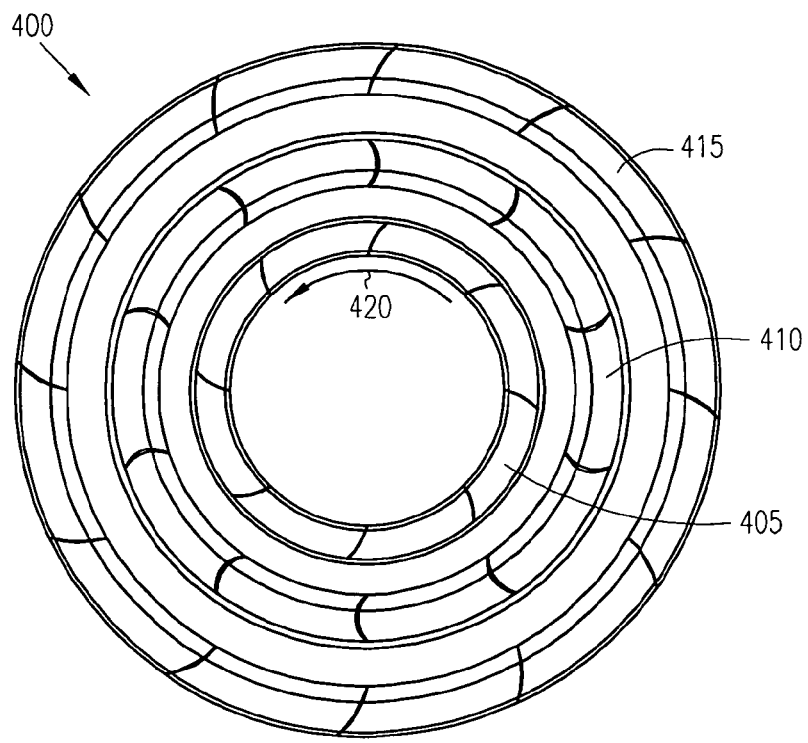
FIG. 4 is a wire frame top view of a multi-stage blower having a mixture of backward facing blades and forward facing blades according to an example embodiment.

FIG. 4 is a wire frame top view of a multi-stage blower 400 having a mixture of backward facing blades and forward facing blades according to an example embodiment. Blower 400 has three concentric rings of curved blades 405, 410 and 415. The direction of rotation of the rings is counterclockwise as indicated by arrow 420. Ring 405 has eight backward facing blades. Ring 410, which has a larger diameter than ring 405 has ten forward facing blades, and ring 415 has twelve backward facing blades. The actual numbers of blades may vary. Further rings may also be included, having either forward or backward facing blades. In one embodiment, the orientation of the blades is alternated in succeeding rings of blades.

Figure 5:
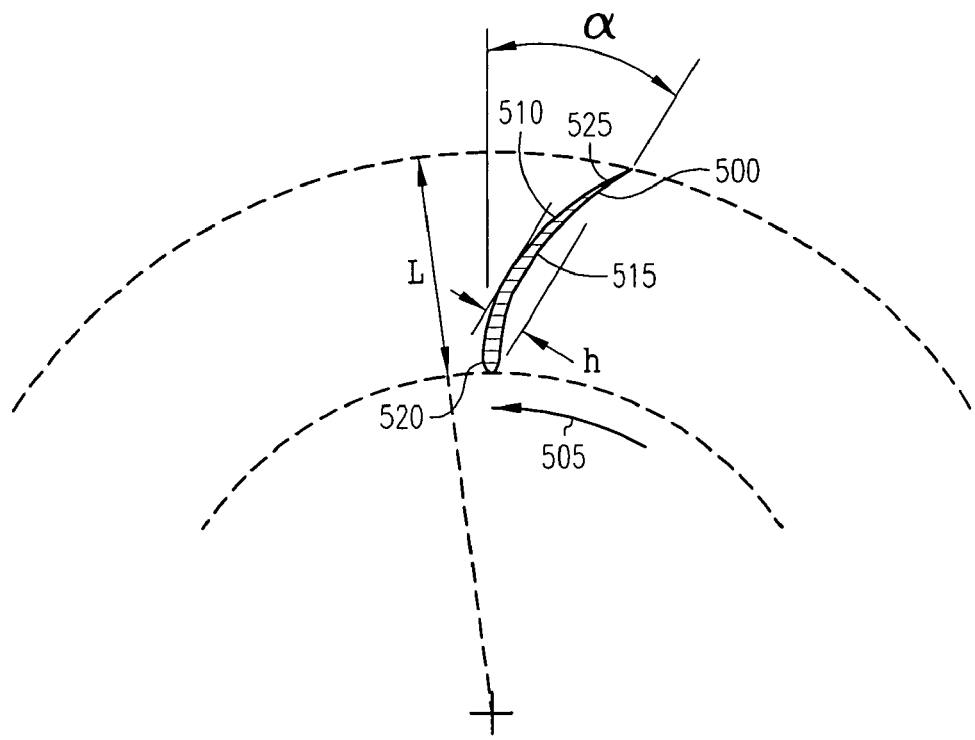
FIG. 5 is a cross section representation of a backward facing blade according to an example embodiment.

FIG. 5 is a cross section representation of a backward facing blade 500 according to an example embodiment. Rotation is counterclockwise as indicated by arrow 505. Blade 500 has a radial length L, with a pressure side 510 and a suction or low pressure side 515. An inner diameter 520 of blade 500 extends substantially radially, with the outer diameter 525 curved backwards with a curvature height, h, away from the direction of rotation. An average angle of backward curve, $\alpha$, is a between 15 and 30 degrees from radial in one embodiment, but may vary even further in other embodiments. In one embodiment, the optimum value is approximately 30 degrees. Outer rings of blades have a steeper blade angle in one embodiment.

Figure 6:
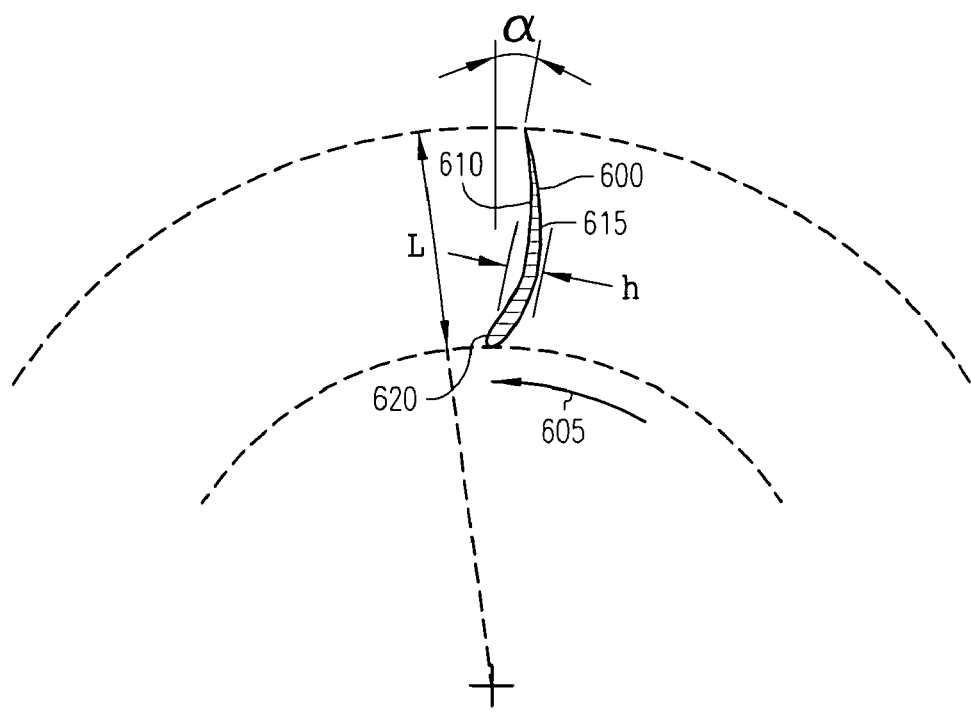
FIG. 6 is a cross section representation of a forward facing blade according to an example embodiment.

FIG. 6 is a cross section representation of a forward facing blade 600 according to an example embodiment. Rotation is counterclockwise as indicated by arrow 605. Blade 600 has a radial length L, with a pressure side 610 and a suction or low pressure side 615. An inner diameter portion 620 of blade 600 extends backward from the direction of rotation, and forms a concave shape towards an outer diameter portion 525 with a curvature height, h, away from the direction of rotation. An average angle of forward curve, $\alpha$, is between approximately 15 and 75 degrees. It may vary between 0 and 90 in further embodiments. In one embodiment, the forward curve angle, $\alpha$, provide optimum performance when slightly less than 20 to 30 degrees.

The total airflow and developed static pressure increases monotonously with the blade length L. So desirably L should be made as large as possible. However L is constrained by the overall wheel size, which is sized to the application, and the number of stages. For a given overall wheel size as defined by its outer diameter, L is fixed by the blade angle, the blade curvature, and the number of blade stages. For a given wheel size and number of stages, the blade length L increases as the blade angle increases.

The flow distribution (inside the installed application) will be more uniform as the number of blade stages is increased for a given size of wheel. However, the blade length L for each stage decreases as more number of stages are used for a given wheel size (outer diameter).

Based on the combined effects of blade length and number of blade stages, the desirable attribute of better flow distribution is opposed by the equally or even more desirable attribute of better impeller performance (in terms of flow and static pressure). These two parameters may be optimized for a particular application.

Figure 7:
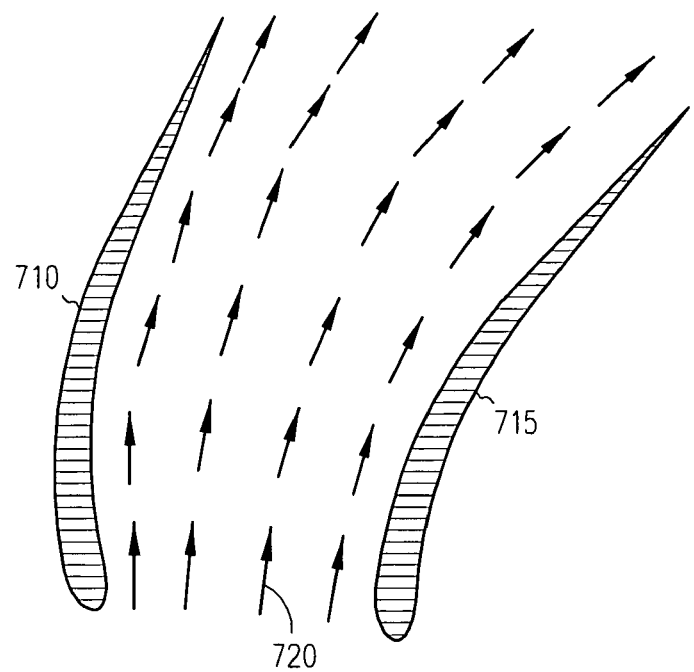
FIG. 7 is a block representation of airflow between backward facing blades according to an example embodiment.

FIG. 7 is a block representation of airflow between backward facing blades according to an example embodiment. Two adjacent blades 710 and 715 of a wheel are used to illustrate air intake with multiple arrows 720 representing the airflow or fluid flow. In this embodiment, blade 710 is the leading blade. Airflow between the blades is a diverging cross section. As fluid flows from the leading edges of the blades toward the trailing edges, induced by the mechanical action of the rotating blades, static pressure recovery occurs without the need for scrolls.

Figure 8:
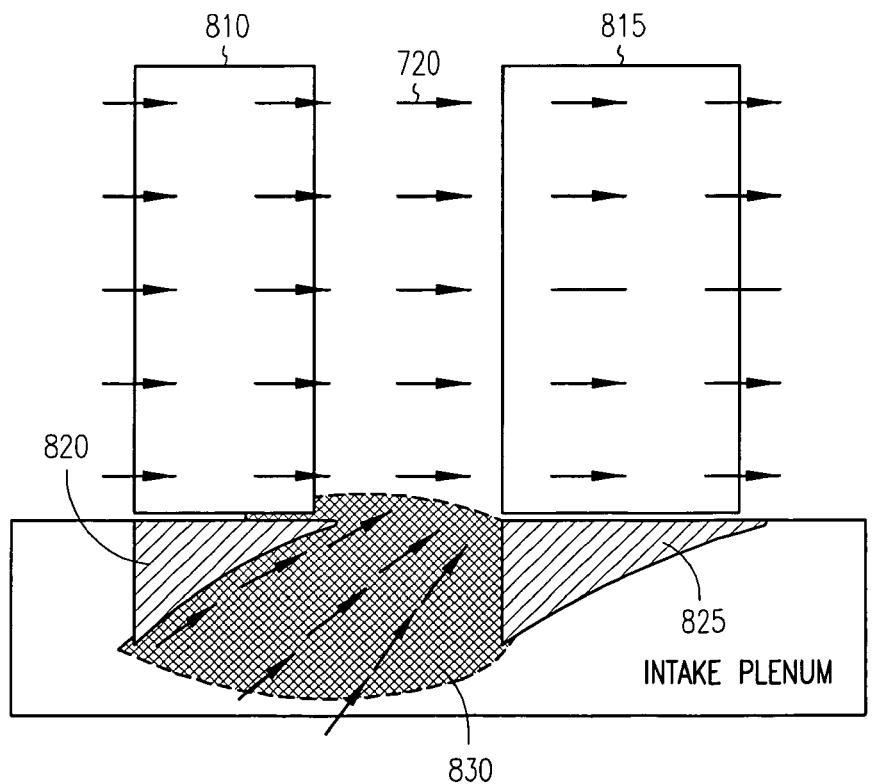
FIG. 8 is a block representation of airflow through an intake plenum of a multi-stage blower according to an example embodiment.

FIG. 8 is a block representation of airflow through an intake plenum of a multi-stage blower according to an example embodiment. Adjacent rings of blades are indicated 810 and 815 each have corresponding inlet rings 820 and 825, between which fluid flows to blade ring 815. The flow of high velocity fluid from one blade stage to the next induces a low pressure region in the intake plenum as indicated at 830. The cross section of the inlet rings 820 and 825 creates a converging shape for an intake port, enabling accelerating airflow to be induced into succeeding states of blades.

As a result, there is an increasing mass flow rate in the radial direction of the blades from intake to exit. Pressure recovery occurs in each blade stage. Flow induction occurs in between each stage, resulting in high flow rates. High static pressures are developed by the multiple stages. Desired flow rates and static pressures can be developed by blowers that have smaller profiles and sizes than those of conventional blowers.

Multi-stage blowers with forward curved blades work essentially on the same principle with the exception that no pressure recovery occurs with blade passages. Like its conventional counterpart, the blowers may be used with a volute scroll around the blades to effect static pressure development.

In further embodiments, rings may run in different or opposite directions if desired, or in the same direction, but at different speeds as defined by revolutions per minute. The directions and speeds may be selected to obtain desired pressure profiles between the rings. Further, individual blade length and angles may be selected, or combinations of blade length, blade angle, density of blades in a ring, direction of rotation of rings and rotational speed of the rings may be varied as desired. Different directions of rotation and different speeds of rotation may be provided by use of belts or cogs in various embodiments.

Figure 9:
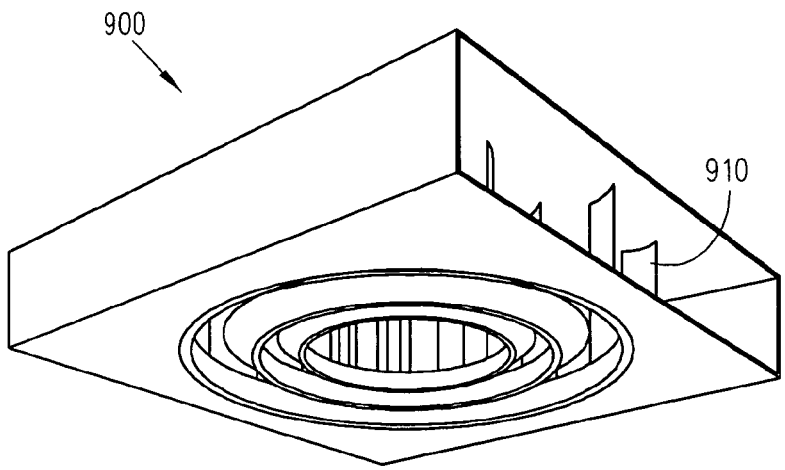
FIG. 9 is perspective view of a single flat pack of a multi-stage blower according to an example embodiment.

FIG. 9 is perspective view of a single flat pack of a multi-stage blower 900 according to an example embodiment. Air intake is through a bottom or top of the pack, through openings between rings. Exhaust is through an opening 910 in a side of the blower 900. In further embodiments, exhaust may be through multiple sides of the blower. In this embodiment, the inlet rings are fixed with respect to the body of the pack, while the sets of blades rotate. A motor or other means of rotating the blades may be disposed on an opposite side of air intake side of the pack. The blades may be spaced apart from the intake rings, or may be couple through ball bearings or other rotational type of connection.

Figure 10:
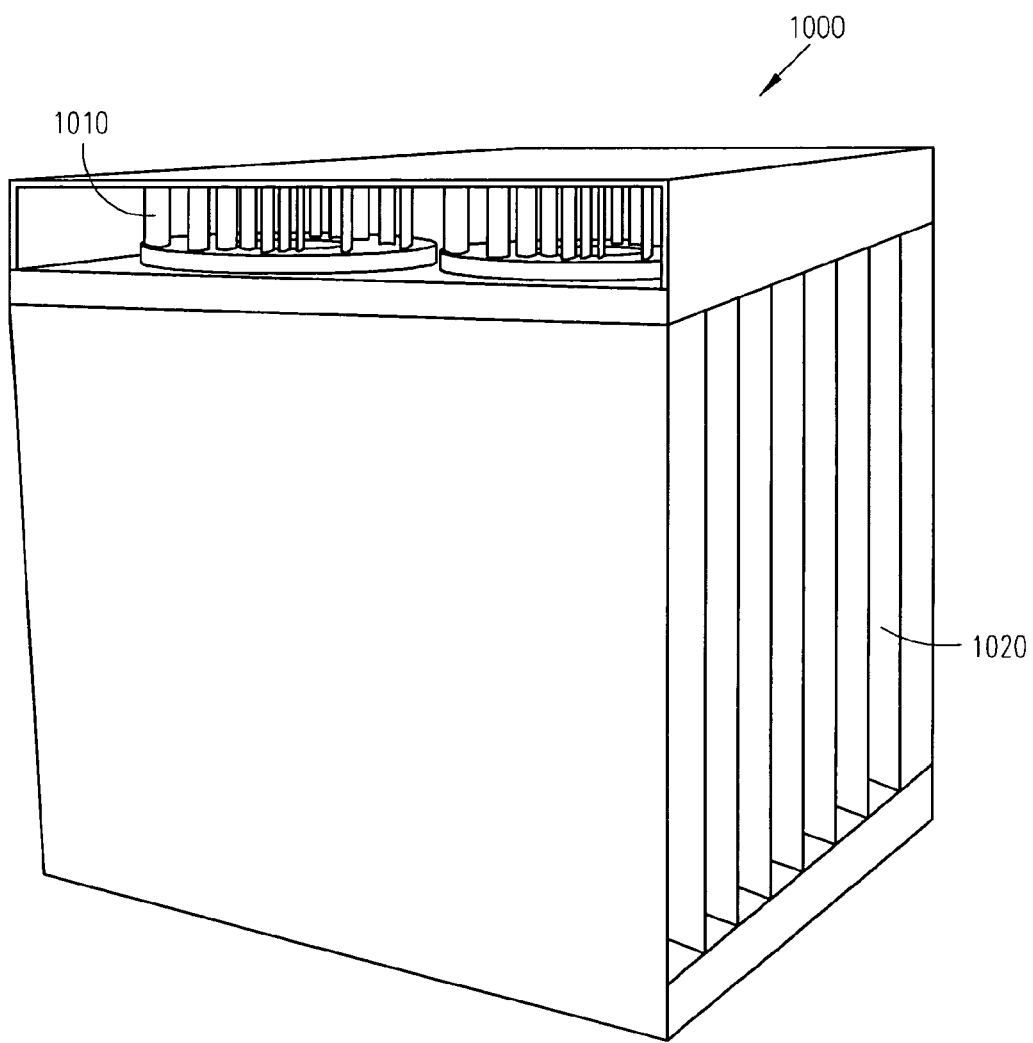
FIG. 10 is a perspective view of a compact component box having four multi-stage blowers.

FIG. 10 is a perspective view of a compact component box 1000 having four multi-stage blowers 1010 located on top of the box 1000. Air is taken in through one side 1020 of the box, and drawn up through blowers 1010 and out at least one side of the box 1000.

Figure 11:
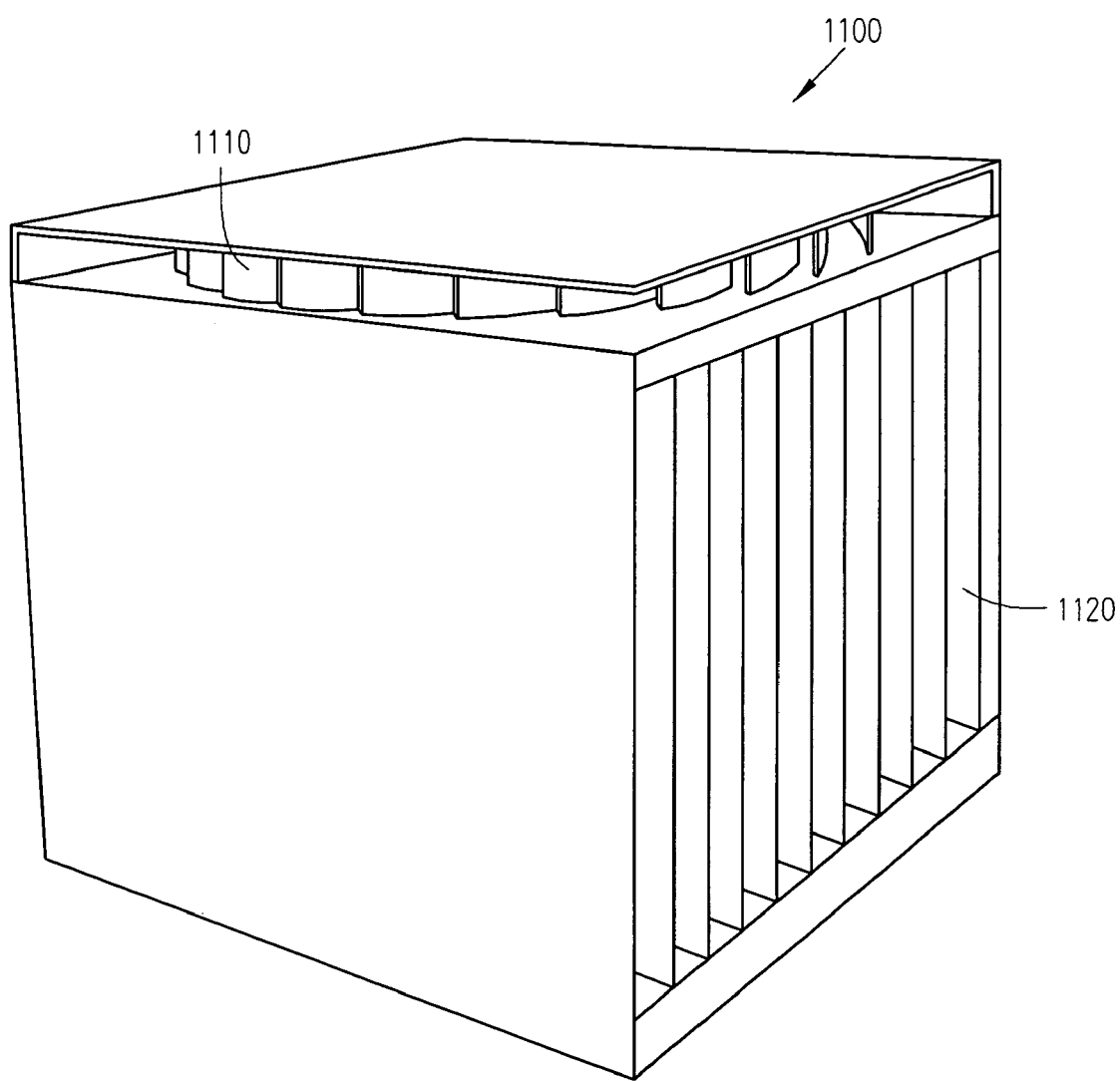
FIG. 11 is a perspective view of a compact component box having a single multi-stage blower.

FIG. 11 is a perspective view of a compact component box 1100 having a single multi-stage blower 1110 drawing air in through a side 1120 of the box. Multiple rings of blades for a very wide blower. This results in air induction occurring essentially across the entire face of the blower, and adequate coverage of all slots or components in the box. Good airflow distribution is achieved across the entire box 1100.

The invention claimed is:

1. A blower comprising:
   a support plate;
   a first rotatable ring of curved blades coupled to the support plate;
   a first inlet ring coupled to the blades of the first ring;
   a second rotatable ring of curved blades coupled to the support plate and radially spaced from the first ring; and
   a second inlet ring coupled to the blades of the second ring.

2. The blower of claim 1 wherein the first inlet ring is shaped to guide airflow to the second ring of curved blades.

3. The blower of claim 1 wherein at least one of the first and second rings of curved blades is forward facing.

4. The blower of claim 1 wherein at least one of the first and second rings of curved blades is backward facing.

5. The blower of claim 1 wherein the inlet rings and rotatable rings rotate together.

6. The blower of claim 1 wherein the first and second inlet rings define multiple inlet ports.

7. The blower of claim 6 wherein the first inlet ring defines a cylindrical opening for air flow to the first ring of curved blades.

8. The blower of claim 6 wherein the first and second inlet rings define an inlet port for air flow to the second ring of curved blades.

9. The blower of claim 6 wherein the first and second inlet rings have converging cross-sections shaped to provide accelerating flow to the respective rings of curved blades.

10. The blower of claim 1 wherein the first and second rotatable rings rotate in different opposite directions.

11. The blower of claim 1 wherein the first and second rotatable rings rotate at different speeds.

12. A blower comprising:
    a support plate;
    multiple sets of rotatable rings of curved blades coupled to the support plate; and
    multiple inlet rings correspondingly coupled to the multiple sets of rotatable rings of curved blades.

13. The blower of claim 12 comprising three sets of rotatable rings and corresponding inlet rings.

14. The blower of claim 12 wherein the number of blades in each ring increases with radial distance from a center of the blower.

15. The blower of claim 12 wherein the blades increase in length with radial distance from a center of the blower.

16. The blower of claim 12 wherein the sets of rotatable rings include both a ring of forward facing blades and a ring of backward facing blades.

17. The blower of claim 12 wherein the sets of rotatable rings include backward facing blades.

18. The blower of claim 12 wherein the backward facing blades are curved, and have an average backward angle of between approximately 15 and 30 degrees.

19. The blower of claim 18 wherein the backward angle is steeper with increasing radial distance from a center of the blower.

20. The blower of claim 12 wherein the blades are approximately perpendicular to the support plate.

21. The blower of claim 12 wherein the inlet rings are triangular shaped to direct airflow radially outward into succeeding sets of blades.

22. The blower of claim 12 wherein one rotatable ring rotates in a different directions.

23. The blower of claim 12 wherein at least one of the rotatable rings rotates at a speed different from another rotatable ring.

24. A blower comprising:
    multiple sets of rotatable rings of curved blades coupled to each other; and
    multiple inlet rings correspondingly coupled to the multiple sets of rotatable rings of blades, wherein the rotatable rings and inlet rings are coupled to a support plate.

25. A blower comprising:
    multiple sets of rotatable rings of blades coupled to each other; and
    multiple inlet rings correspondingly coupled to the multiple sets of rotatable rings of blades, wherein the blades are backward facing blades such that static pressure rises in the radial direction as the blades rotate.

26. The blower of claim 25 wherein the blades extend radially from a center of rotation of the rotatable rings of blades and angle backwards from the direction of rotation.

27. The blower of claim 26 wherein the average backward angle is between approximately 15 to 30 degrees.

28. The blower of claim 27 wherein the average backward angle increases in rings more radially distant from the center of rotation.

29. The blower of claim 26 wherein the blades curve with an increasing backwards angle with radial distance from the center of rotation.

30. The blower of claim 26 wherein the blades comprise a curvature height that increases in rings more radially distant from the center of rotation.

31. The blower of claim 24 and further comprising a volute shrouding the blower, and wherein the blades are forward facing curved blades.

32. The blower of claim 31 wherein the forward facing curved blades are concave with respect to the direction of rotation of the blades.

33. A blower comprising:
    multiple sets of rotatable rings of blades coupled to each other; and
    multiple inlet rings correspondingly coupled to the multiple sets of rotatable rings of blades, wherein the blower has an overall height of approximately 1 inch or less.

34. The blower of claim 24 wherein one rotatable ring rotates in a different directions.

35. The blower of claim 24 wherein at least one of the rotatable rings rotates at a speed different from another rotatable ring.

* * * * *